(12) United States Patent
Wang

(10) Patent No.: US 9,614,483 B2
(45) Date of Patent: Apr. 4, 2017

(54) CURRENT ANALOG AUDIO AMPLIFIER

(71) Applicant: Fengshuo Wang, Zhejiang (CN)

(72) Inventor: Fengshuo Wang, Zhejiang (CN)

( * ) Notice: Subject to any disclaimer, the term of this patent is extended or adjusted under 35 U.S.C. 154(b) by 0 days.

(21) Appl. No.: 14/915,901

(22) PCT Filed: Apr. 21, 2014

(86) PCT No.: PCT/CN2014/075775
§ 371 (c)(1),
(2) Date: Mar. 2, 2016

(87) PCT Pub. No.: WO2015/139352
PCT Pub. Date: Sep. 24, 2015

(65) Prior Publication Data
US 2016/0218684 A1   Jul. 28, 2016

(30) Foreign Application Priority Data

Mar. 18, 2014   (CN) ..................... 2014 2 0119514 U

(51) Int. Cl.
| | |
|---|---|
| H03F 1/30 | (2006.01) |
| H03F 1/34 | (2006.01) |
| H03F 3/183 | (2006.01) |
| H03F 3/187 | (2006.01) |
| H03F 3/30 | (2006.01) |

(52) U.S. Cl.
CPC .............. *H03F 1/34* (2013.01); *H03F 3/183* (2013.01); *H03F 3/187* (2013.01); *H03F 3/3069* (2013.01); *H03F 2200/03* (2013.01); *H03F 2200/153* (2013.01); *H03F 2200/18* (2013.01)

(58) Field of Classification Search
USPC ......................................... 330/290, 302, 264
IPC .......................................................... H03F 1/30
See application file for complete search history.

(56) References Cited

U.S. PATENT DOCUMENTS

| | | | | |
|---|---|---|---|---|
| 5,278,515 | A * | 1/1994 | Mathews | ................ H03F 3/085 250/214 A |
| 2005/0024143 | A1* | 2/2005 | Humphrey | ................ H03F 1/22 330/255 |
| 2006/0055383 | A1* | 3/2006 | Eberlein | ................. G05F 1/575 323/280 |
| 2006/0186958 | A1* | 8/2006 | Carreto | ............... H03F 3/45174 330/267 |
| 2009/0278604 | A1* | 11/2009 | Chen | ................... H03F 3/45183 330/261 |

* cited by examiner

*Primary Examiner* — Patricia T Nguyen

(57) ABSTRACT

A current analog audio amplifier having an operational amplifier current-reading and voltage-controlling current source, a voltage gain stage, an output buffer stage, a negative feedback circuit, a high-frequency compensation circuit, and a bias circuit. The operational amplifier current-reading and voltage-controlling current source is connected to the voltage gain stage. The voltage gain stage is connected to the output buffer stage. The negative feedback circuit is connected to the operational amplifier current-reading and voltage-controlling current source. The high-frequency compensation circuit and the bias circuit are connected separately to the operational amplifier current-reading and voltage-controlling current source.

7 Claims, 1 Drawing Sheet

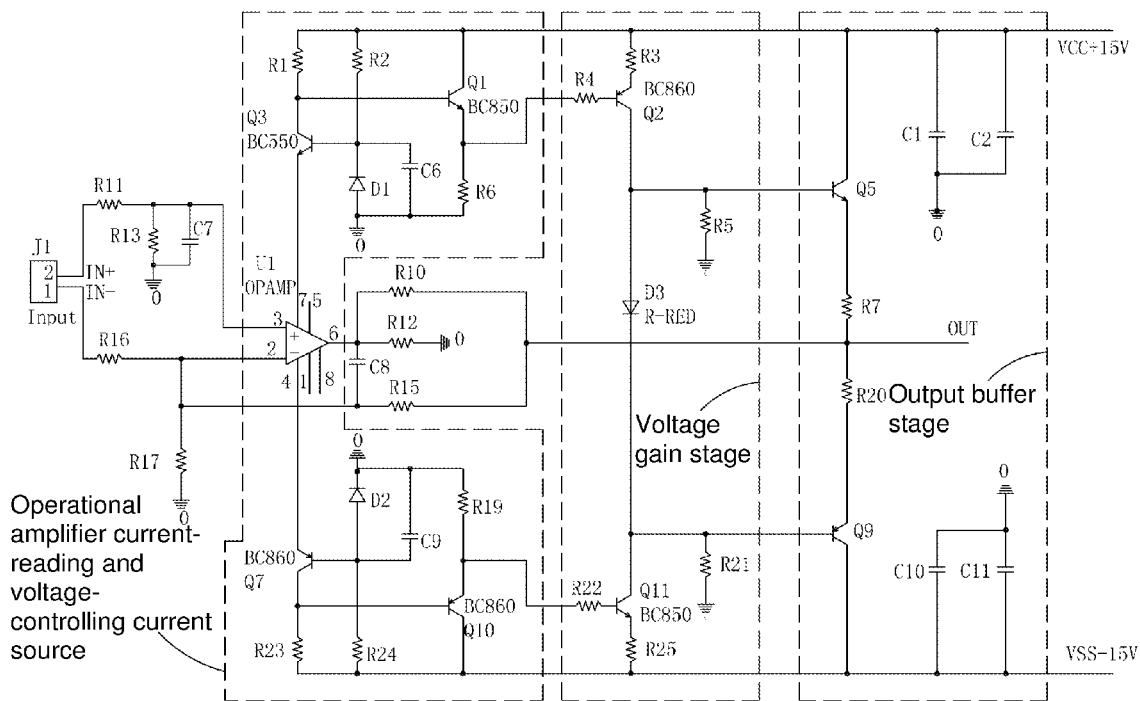

CURRENT ANALOG AUDIO AMPLIFIER

BACKGROUND OF THE INVENTION

The present invention belongs to the field of high-fidelity electronic audio technology and more particularly pertains to a current analog audio amplifier.

Conventional amplifiers adopt negative feedback technology in the hope of achieving low distortion and ultra-wide frequency response. Unfortunately, although the negative feedback technology can reduce the distortion of general amplifiers and broaden the frequency response, transient intermodulation distortion caused by conventional negative feedback audio amplifiers when processing large dynamic high frequency signals produces "dry" and unpleasant sound, and gradually becomes system bottleneck. In order to avoid transient intermodulation distortion, technologies with shallow negative feedback and even without feedback should be used. These technologies pay a high price, yet none of them can fundamentally solve the problem. System stability problems may also exist. Machines or even speakers are easy to be burned due to electrical fault.

Since phase shift problems exist in conventional negative feedback circuits, distortion of conventional audio amplifiers at high frequencies (6 kHz above) is obviously worsened in comparison with that at 1 kHz. Full-range ultra-low distortion is not possible.

Currently, high resolution mastering music is popular. Audio band extends to 100 kHz. The dynamic range reaches up to 120 dB. Conventional voltage-analog audio amplifiers cannot achieve ultra-wide frequency response due to limitations of circuit structure. People's demand for a new high-fidelity power amplifier with wideband and low distortion is more urgent.

In 1975, Gilbertc invented the word "translinear" which was first reported at the ISSCC, marking that the current analog concept was formally introduced. At the $87^{th}$ AES Society Convention in 1989, British scholar D. C Wadsworth first proposed that the application of current analog circuits in audio can result in an ultra-fast and ultra-low distortion technical performance. In 2005, Wang Fengshuo (the applicant himself) applied a utility model patent for "Current Analog High Fidelity Power Amplifier" based on full discrete devices. However, since the amplifier performance depends on the matching and screening of the discrete devices, translinear (TL) circuit inside the current analog amplifier has strict requirements in matching transistors. Problems of consistency of product performance as well as higher actual production cost exist. In a current analog circuit, the transistor interelectrode capacitor which affects the speed and bandwidth works on very low impedance nodes (usually a few ohms to dozens of ohms only, which is one hundredth to one thousandth of the impedance nodes for a general voltage analog amplifier). Under the effect of the current signal having a large swing, charging and discharging of the transistor interelectrode capacitor can be done quickly, so the working speed under large signal is much quicker than conventional voltage analog circuit. Influence of parasitic capacitor in the circuit on distortion is also avoided. Thus the current analog circuits are with ultra-high precision and ultra-low distortion.

BRIEF SUMMARY OF THE INVENTION

In view of the aforesaid problems, the present invention provides a current analog audio amplifier.

The technical solutions adopted by the present invention to solve the aforesaid problems are as follows: a current analog audio amplifier, which comprises an operational amplifier current-reading and voltage-controlling current source, a voltage gain stage, an output buffer stage, a negative feedback circuit, a high-frequency compensation circuit and a bias circuit; the operational amplifier current-reading and voltage-controlling current source is connected to the voltage gain stage; the voltage gain stage is connected to the output buffer stage; the negative feedback circuit is connected to the operational amplifier current-reading and voltage-controlling current source; the high-frequency compensation circuit and the bias circuit are connected separately to the operational amplifier current-reading and voltage-controlling current source.

Further, the operational amplifier current-reading and voltage-controlling current source comprises a universal single-channel operational amplifier U1, a third transistor Q3, a first resistor R1, a second resistor R2, a first transistor Q1, a first diode D1, a sixth capacitor C6, a sixth resistor R6, a seventh transistor Q7, a second diode D2, a ninth capacitor C9, a nineteenth resistor R19, a tenth transistor Q10, a twenty-third resistor R23 and a twenty-fourth resistor R24; an emitter of the third transistor Q3 connects to a $7^{th}$ pin of the operational amplifier U1; the first resistor R1 and a base of the first transistor Q1 connect to a collector of the third transistor Q3; the first diode D1 has a negative electrode which connects to the collector of the third transistor Q3 and a positive electrode which connects to ground; the sixth capacitor C6 has one end which connects to the collector of the third transistor Q3 and an other end which connects to ground; the sixth resistor R6 has one end which connects to an emitter of the first transistor Q1 and an other end which connects to ground; an emitter of the seventh transistor Q7 connects to a $4^{th}$ pin of the operational amplifier U1; the second diode D2 has a positive electrode which connects to a base of the seventh transistor Q7 and a negative electrode which connects to ground; the ninth capacitor C9 has one end which connects to the base of the seventh transistor Q7 and an other end which connects to ground; the nineteenth resistor R19 has one end which connects to ground and an other end which connects to an emitter of the tenth transistor Q10; the twenty-third resistor R23 and a base of the tenth transistor Q10 connect to a collector of the seventh transistor Q7.

Furthermore, the voltage gain stage comprises a second transistor Q2, a third resistor R3, a fourth resistor R4, a fifth resistor R5, a third diode D3, a twenty-first resistor R21, a twenty-second resistor R22, an eleventh transistor Q11 and a twenty-fifth resistor R25; the third resistor R3 has one end which connects to an emitter of the second transistor Q2 and an other end which connects to the first resistor R1, the second resistor R2 and a collector of the first transistor Q1; the fourth resistor R4 has one end which connects to a base of the second transistor Q2 and an other end which connects to the emitter of the first transistor Q1; the fifth resistor R5 has one end which connects to a collector of the second transistor Q2 and an other end which connects to ground; the third diode D3 has a positive electrode which connects to the collector of the second transistor Q2 and a negative electrode which connects to a collector of the eleventh transistor Q11 and the twenty-first resistor R21; the twenty-second resistor R22 has one end which connects to the emitter of the tenth transistor Q10 and an other end which connects to the base of the tenth transistor Q10; the twenty-fifth resistor R25 has one end which connects to an emitter of the eleventh transistor Q11 and an other end which connects to the twenty-third resistor R23, the twenty-fourth resistor R24 and a collector of the tenth transistor Q10.

Furthermore, the output buffer stage comprises a fifth transistor Q5, a seventh resistor R7, a twentieth resistor R20, a ninth transistor Q9, a first capacitor C1, a second capacitor C2, a tenth capacitor C10 and an eleventh capacitor C11; one end of the first capacitor C1, one end of the second capacitor C2 and a collector of the fifth transistor Q5 connect to +15V; an other end of the first capacitor C1 and an other end of the second capacitor C2 connect to ground respectively; a base of the fifth transistor Q5 connects to the collector of the second transistor Q2; an emitter of the fifth transistor Q5 connects to an audio amplifier output through the seventh resistor R7; an emitter of the ninth transistor Q9 connects to the audio amplifier output through the twentieth resistor R20; a base of the ninth transistor Q9 connects to the collector of the eleventh transistor Q11; one end of the tenth capacitor C10, one end of the eleventh capacitor C11 and a collector of the ninth transistor Q9 connect to −15V; an other end of the tenth capacitor C10 and an other end of the eleventh capacitor C11 connect to ground respectively.

Furthermore, the negative feedback circuit comprises a tenth resistor R10, a fifteenth resistor R15 and a seventeenth resistor R17; the tenth resistor R10 has one end which connects to a $6^{th}$ pin of the operational amplifier U1 and an other end which connects to the audio amplifier output; the fifteenth resistor R15 has one end which connects to a $1^{st}$ pin of the operational amplifier U1 and an other end which connects to the audio amplifier output; the seventeenth resistor R17 has one end which connects to a $2^{nd}$ pin of the operational amplifier U1 and an other end which connects to ground.

Furthermore, the high-frequency compensation circuit comprises an eighth capacitor C8; the eighth capacitor C8 has one end which connects to the $2^{nd}$ pin of the operational amplifier U1 and an other end which connects to the $6^{th}$ pin of the operational amplifier U1.

Furthermore, the bias circuit comprises a twelfth resistor R12; the twelfth resistor R12 has one end which connects to the $6^{th}$ pin of the operational amplifier U1 and an other end which connects to ground.

The present invention has the following advantages:

The present invention does not increase cost and, without using special components, successfully challenges the modern audio testing limit of super-low distortion of 0.0003% (below 0.0005% for the full frequency spectrum between 20 Hz and 20 kHz) and ultra-wide frequency response amplification (0-500 kHz; +0, −3 dB). In intermodulation distortion (IMD) tests, all voice and distortion components are below 110 dB. Full power bandwidth of the current analog amplifier is close to closed-loop bandwidth. Slew rate increases linearly with the input signal amplitude. These features are completely different from conventional voltage analog amplifiers. Ultra-low distortion and ultra-high-speed amplification are achieved. The features of ultralow distortion and high-speed amplification can thus result in preeminent high fidelity and music reproducibility. Consistency and reliability of product performance are ensured, and a higher performance specification is achieved.

In addition to the objectives, features and advantages described above, the present invention also has other objectives, features and advantages. The present invention will be further described in detail below with reference to the accompanying drawing.

BRIEF DESCRIPTION OF THE DRAWINGS

The accompanying drawing constitutes a part of this application and is used to provide a further understanding of the present invention. Exemplary embodiment of the present invention and the description thereof are used to explain the present invention, and should not be construed to unduly limit the present invention.

FIG. 1 is a schematic view of an embodiment of the present invention.

DETAILED DESCRIPTION OF THE INVENTION

To further clarify the objectives, technical solutions and advantages of the present invention, the present invention is further described in detail below with reference to the accompanying drawing and specific embodiment. It should be appreciated that the specific embodiment described herein is only used to explain the present invention without limiting the present invention.

Referring to FIG. 1, a current analog audio amplifier as shown in the FIGURE comprises an operational amplifier current-reading and voltage-controlling current source, a voltage gain stage, an output buffer stage, a negative feedback circuit, a high-frequency compensation circuit and a bias circuit; the operational amplifier current-reading and voltage-controlling current source is connected to the voltage gain stage; the voltage gain stage is connected to the output buffer stage; the negative feedback circuit is connected to the operational amplifier current-reading and voltage-controlling current source; the high-frequency compensation circuit and the bias circuit are connected separately to the operational amplifier current-reading and voltage-controlling current source.

The operational amplifier current-reading and voltage-controlling current source comprises a universal single-channel operational amplifier U1, a third transistor Q3, a first resistor R1, a second resistor R2, a first transistor Q1, a first diode D1, a sixth capacitor C6, a sixth resistor R6, a seventh transistor Q7, a second diode D2, a ninth capacitor C9, a nineteenth resistor R19, a tenth transistor Q10, a twenty-third resistor R23 and a twenty-fourth resistor R24; an emitter of the third transistor Q3 connects to a $7^{th}$ pin of the operational amplifier U1; the first resistor R1 and a base of the first transistor Q1 connect to a collector of the third transistor Q3; the first diode D1 has a negative electrode which connects to the collector of the third transistor Q3 and a positive electrode which connects to ground; the sixth capacitor C6 has one end which connects to the collector of the third transistor Q3 and an other end which connects to ground; the sixth resistor R6 has one end which connects to an emitter of the first transistor Q1 and an other end which connects to ground; an emitter of the seventh transistor Q7 connects to a $4^{th}$ pin of the operational amplifier U1; the second diode D2 has a positive electrode which connects to a base of the seventh transistor Q7 and a negative electrode which connects to ground; the ninth capacitor C9 has one end which connects to the base of the seventh transistor Q7 and an other end which connects to ground; the nineteenth resistor R19 has one end which connects to ground and an other end which connects to an emitter of the tenth transistor Q10; the twenty-third resistor R23 and a base of the tenth transistor Q10 connect to a collector of the seventh transistor Q7.

The voltage gain stage comprises a second transistor Q2, a third resistor R3, a fourth resistor R4, a fifth resistor R5, a third diode D3, a twenty-first resistor R21, a twenty-second resistor R22, an eleventh transistor Q11 and a twenty-fifth resistor R25; the third resistor R3 has one end which connects to an emitter of the second transistor Q2 and an other end which connects to the first resistor R1, the second resistor R2 and a collector of the first transistor Q1; the fourth resistor R4 has one end which connects to a base of the second transistor Q2 and an other end which connects to the emitter of the first transistor Q1; the fifth resistor R5 has one end which connects to a collector of the second transistor Q2 and an other end which connects to ground; the third diode D3 has a positive electrode which connects to the collector of the second transistor Q2 and a negative electrode which connects to a collector of the eleventh transistor Q11 and the twenty-first resistor R21; the twenty-second resistor R22 has one end which connects to the emitter of the tenth transistor Q10 and an other end which connects to the base of the tenth transistor Q10; the twenty-fifth resistor R25 has one end which connects to an emitter of the eleventh transistor Q11 and an other end which connects to the twenty-third resistor R23, the twenty-fourth resistor R24 and a collector of the tenth transistor Q10.

The output buffer stage comprises a fifth transistor Q5, a seventh resistor R7, a twentieth resistor R20, a ninth transistor Q9, a first capacitor C1, a second capacitor C2, a tenth capacitor C10 and an eleventh capacitor C11; one end of the first capacitor C1, one end of the second capacitor C2 and a collector of the fifth transistor Q5 connect to +15V; an other end of the first capacitor C1 and an other end of the second capacitor C2 connect to ground respectively; a base of the fifth transistor Q5 connects to the collector of the second transistor Q2; an emitter of the fifth transistor Q5 connects to an audio amplifier output through the seventh resistor R7; an emitter of the ninth transistor Q9 connects to the audio amplifier output through the twentieth resistor R20; a base of the ninth transistor Q9 connects to the collector of the eleventh transistor Q11; one end of the tenth capacitor C10, one end of the eleventh capacitor C11 and a collector of the ninth transistor Q9 connect to −15V; an other end of the tenth capacitor C10 and an other end of the eleventh capacitor C11 connect to ground respectively.

The negative feedback circuit comprises a tenth resistor R10, a fifteenth resistor R15 and a seventeenth resistor R17; the tenth resistor R10 has one end which connects to a $6^{th}$ pin of the operational amplifier U1 and an other end which connects to the audio amplifier output; the fifteenth resistor R15 has one end which connects to a $1^{st}$ pin of the operational amplifier U1 and an other end which connects to the audio amplifier output; the seventeenth resistor R17 has one end which connects to a $2^{nd}$ pin of the operational amplifier U1 and an other end which connects to ground.

The high-frequency compensation circuit comprises an eighth capacitor C8; the eighth capacitor C8 has one end which connects to the $2^{nd}$ pin of the operational amplifier U1 and an other end which connects to the $6^{th}$ pin of the operational amplifier U1.

The bias circuit comprises a twelfth resistor R12; the twelfth resistor R12 has one end which connects to the $6^{th}$ pin of the operational amplifier U1 and an other end which connects to ground.

Input voltage signal first passes through in-phase(+) or anti-phase(−) input end of U1. Due to a load R12 of U1, input voltage signal has a corresponding current signal output at the $4^{th}$ pin and the $7^{th}$ pin of U1. VCCS process is completed. Q3 and Q7 read out the changing current of VCCS and pass to R1 and R23 to convert into a voltage signal, which is sent to Q2 and Q11 to complete voltage amplification after being buffered by Q1 and Q10, and finally output to drive the load through Q5 and Q9. The dual-loop negative feedback is composed of R10, R15, R17 and C8. System performance and stability are ensured. With the operational amplifier as the core, it is constituted by combining with one pair of complementary NPN and PNP tube Q3, Q7. The emitters of Q3, Q7 connect to the positive and negative power supply pins of the operational amplifier. Bias voltages of the bases are set by D1 and D2. D1 and D2 set the bias of Q3 and Q7 and determine the operating voltage of U1. Quiescent current of U1 determines the quiescent current of Q3 and Q7. R1 and R23 convert the current read out from Q3, Q7 into voltage, and send to voltage amplifier stage Q2 and 11 constituted by a pair of complementary NPN and PNP to complete voltage amplification after being buffered by Q1 and Q10. The big loop negative feedback network is composed of R15 and R17. The resistor R15 has one end which connects to the output and an other end which connects to the anti-phase input end of U1, ranging in value between 500-2000 ohms. R17 has one end which connects to the anti-phase input end of U1 and an other end which connects to ground. C8 constitutes a high-frequency compensation capacitor. C8 has one end which connects to the output of U1 and an other end which connects to the anti-phase input end of U1, ranging in value between 100-2000 PF. The amplifier frequency response is adjusted by adjusting the capacitance of C8. R12 constitutes U1 load resistance. R12 has one end which connects to the output of U1 and an other end which connects to ground, ranging in value between 100-2000 ohms.

The present invention does not increase cost and, without using special components, successfully challenges the modern audio testing limit of super-low distortion of 0.0003% (below 0.0005% for the full frequency spectrum between 20 Hz and 20 kHz) and ultra-wide frequency response amplification (0-500 kHz; +0, −3 dB). In intermodulation distortion (IMD) tests, all voice and distortion components are below 110 dB. Full power bandwidth of the current analog amplifier is close to closed-loop bandwidth. Slew rate increases linearly with the input signal amplitude. These features are completely different from conventional voltage analog amplifiers. Ultra-low distortion and ultra-high-speed amplification are achieved. The features of ultralow distortion and high-speed amplification can thus result in preeminent high fidelity and music reproducibility. Consistency and reliability of product performance are ensured, and a higher performance specification is achieved.

The above description is merely a preferred embodiment of the present invention, and is not intended to limit the present invention. Any modification, equivalent replacement and improvement made within the spirit and principles of the present invention should be within the scope of protection of the present invention.

What is claimed is:

1. A current analog audio amplifier, characterized in that it comprises an operational amplifier current-reading and voltage-controlling current source, a voltage gain stage, an output buffer stage, a negative feedback circuit, a high-frequency compensation circuit and a bias circuit; the operational amplifier current-reading and voltage-controlling current source is connected to the voltage gain stage; the voltage gain stage is connected to the output buffer stage; the negative feedback circuit is connected to the operational amplifier current-reading and voltage-controlling current source; the high-frequency compensation circuit and the bias circuit are connected separately to the operational amplifier current-reading and voltage-controlling current source.

2. The current analog audio amplifier as in claim 1, characterized in that the operational amplifier current-reading and voltage-controlling current source comprises a universal single-channel operational amplifier U1, a third transistor Q3, a first resistor R1, a second resistor R2, a first transistor Q1, a first diode D1, a sixth capacitor C6, a sixth resistor R6, a seventh transistor Q7, a second diode D2, a ninth capacitor C9, a nineteenth resistor R19, a tenth transistor Q10, a twenty-third resistor R23 and a twenty-fourth resistor R24; an emitter of the third transistor Q3 connects to a $7^{th}$ pin of the operational amplifier U1; the first resistor R1 and a base of the first transistor Q1 connect to a collector of the third transistor Q3; the first diode D1 has a negative electrode which connects to the collector of the third transistor Q3 and a positive electrode which connects to ground; the sixth capacitor C6 has one end which connects to the collector of the third transistor Q3 and an other end which connects to ground; the sixth resistor R6 has one end which connects to an emitter of the first transistor Q1 and an other end which connects to ground; an emitter of the seventh transistor Q7 connects to a $4^{th}$ pin of the operational amplifier U1; the second diode D2 has a positive electrode which connects to a base of the seventh transistor Q7 and a negative electrode which connects to ground; the ninth capacitor C9 has one end which connects to the base of the seventh transistor Q7 and an other end which connects to ground; the nineteenth resistor R19 has one end which connects to ground and an other end which connects to an emitter of the tenth transistor Q10; the twenty-third resistor R23 and a base of the tenth transistor Q10 connect to a collector of the seventh transistor Q7.

3. The current analog audio amplifier as in claim 2, characterized in that the voltage gain stage comprises a second transistor Q2, a third resistor R3, a fourth resistor R4, a fifth resistor R5, a third diode D3, a twenty-first resistor R21, a twenty-second resistor R22, an eleventh transistor Q11 and a twenty-fifth resistor R25; the third resistor R3 has one end which connects to an emitter of the second transistor Q2 and an other end which connects to the first resistor R1, the second resistor R2 and a collector of the first transistor Q1; the fourth resistor R4 has one end which connects to a base of the second transistor Q2 and an other end which connects to the emitter of the first transistor Q1; the fifth resistor R5 has one end which connects to a collector of the second transistor Q2 and an other end which connects to ground; the third diode D3 has a positive electrode which connects to the collector of the second transistor Q2 and a negative electrode which connects to a collector of the eleventh transistor Q11 and the twenty-first resistor R21; the twenty-second resistor R22 has one end which connects to the emitter of the tenth transistor Q10 and an other end which connects to the base of the tenth transistor Q10; the twenty-fifth resistor R25 has one end which connects to an emitter of the eleventh transistor Q11 and an other end which connects to the twenty-third resistor R23, the twenty-fourth resistor R24 and a collector of the tenth transistor Q10.

4. The current analog audio amplifier as in claim 3, characterized in that the output buffer stage comprises a fifth transistor Q5, a seventh resistor R7, a twentieth resistor R20, a ninth transistor Q9, a first capacitor C1, a second capacitor C2, a tenth capacitor C10 and an eleventh capacitor C11; one end of the first capacitor C1, one end of the second capacitor C2 and a collector of the fifth transistor Q5 connect to +15V; an other end of the first capacitor C1 and an other end of the second capacitor C2 connect to ground respectively; a base of the fifth transistor Q5 connects to the collector of the second transistor Q2; an emitter of the fifth transistor Q5 connects to an audio amplifier output through the seventh resistor R7; an emitter of the ninth transistor Q9 connects to the audio amplifier output through the twentieth resistor R20; a base of the ninth transistor Q9 connects to the collector of the eleventh transistor Q11; one end of the tenth capacitor C10, one end of the eleventh capacitor C11 and a collector of the ninth transistor Q9 connect to −15V; an other end of the tenth capacitor C10 and an other end of the eleventh capacitor C11 connect to ground respectively.

5. The current analog audio amplifier as in claim 2, characterized in that the negative feedback circuit comprises a tenth resistor R10, a fifteenth resistor R15 and a seventeenth resistor R17; the tenth resistor R10 has one end which connects to a $6^{th}$ pin of the operational amplifier U1 and an other end which connects to the audio amplifier output; the fifteenth resistor R15 has one end which connects to a $1^{st}$ pin of the operational amplifier U1 and an other end which connects to the audio amplifier output; the seventeenth resistor R17 has one end which connects to a $2^{nd}$ pin of the operational amplifier U1 and an other end which connects to ground.

6. The current analog audio amplifier as in claim 1, characterized in that the high-frequency compensation circuit comprises an eighth capacitor C8; the eighth capacitor C8 has one end which connects to a $2^{nd}$ pin of the operational amplifier U1 and an other end which connects to a $6^{th}$ pin of the operational amplifier U1.

7. The current analog audio amplifier as described in claim 6, characterized in that the bias circuit comprises a twelfth resistor R12; the twelfth resistor R12 has one end which connects to the $6^{th}$ pin of the operational amplifier U1 and an other end which connects to ground.

\* \* \* \* \*